(12) United States Patent
Tsui et al.

(10) Patent No.: US 7,206,707 B1
(45) Date of Patent: Apr. 17, 2007

(54) WIDEBAND DIGITAL IFM RECEIVER

(75) Inventors: James B. Y. Tsui, Dayton, OH (US); Stuart Mitchell Lopata, Pallsades Park, NJ (US); Charles Richard Ward, Wellsboro, PA (US)

(73) Assignee: ITT Manufacturing Enterprises Inc., Wilmington, DE (US)

( * ) Notice: Subject to any disclaimer, the term of this patent is extended or adjusted under 35 U.S.C. 154(b) by 0 days.

(21) Appl. No.: 11/170,121

(22) Filed: Jun. 29, 2005

(51) Int. Cl.
  *G01R 23/00* (2006.01)
  *G06F 19/00* (2006.01)
  *G01S 13/00* (2006.01)
  *G01S 7/36* (2006.01)

(52) U.S. Cl. .......................... 702/75; 342/194; 342/13
(58) Field of Classification Search .................. 702/75
  See application file for complete search history.

(56) References Cited

U.S. PATENT DOCUMENTS

| | | | |
|---|---|---|---|
| 4,336,541 A | | 6/1982 | Tsui et al. |
| 4,426,648 A | | 1/1984 | Tsui et al. |
| 4,547,727 A | | 10/1985 | Tsui et al. |
| 4,633,516 A | * | 12/1986 | Tsui ........................ 455/226.1 |
| 4,928,105 A | * | 5/1990 | Langner ..................... 342/192 |
| 4,963,816 A | * | 10/1990 | Tsui et al. ................ 324/76.35 |
| 5,099,243 A | * | 3/1992 | Tsui et al. ................ 324/76.47 |
| 5,109,188 A | * | 4/1992 | Sanderson et al. ....... 324/76.35 |
| 5,291,125 A | | 3/1994 | Tsui et al. |
| 5,499,391 A | | 3/1996 | Tsui |
| 5,793,323 A | * | 8/1998 | Tsui ........................... 342/13 |
| 5,917,737 A | * | 6/1999 | Tsui et al. .................. 708/403 |
| 6,411,076 B1 | | 6/2002 | Rudish |

* cited by examiner

*Primary Examiner*—John Barlow
*Assistant Examiner*—Lisa Sievers
(74) *Attorney, Agent, or Firm*—RatnerPrestia

(57) ABSTRACT

An IFM receiver includes a hybrid for outputting I and Q signals from a received input signal; a first ADC for digitizing the I signal to produce a first digital signal at a sampling rate of $1/\tau$, and a second ADC for digitizing the Q signal to produce a second digital signal at the same sampling rate. A processor is configured to (a) delay the first and second digital signals by at least one sample time of $\tau$, (b) count the number of samples produced having predetermined phase shifts, and (c) determine the frequency of the received input signal, based on the number of samples having the predetermined phase shifts. The first and second ADCs are each 1-bit analog-to-digital converters. The predetermined phase shifts of 0°, 90°, −90° and 180° are counted by the processor over a predetermined time interval.

16 Claims, 10 Drawing Sheets

1 DELAY TIME

4 DELAY TIMES

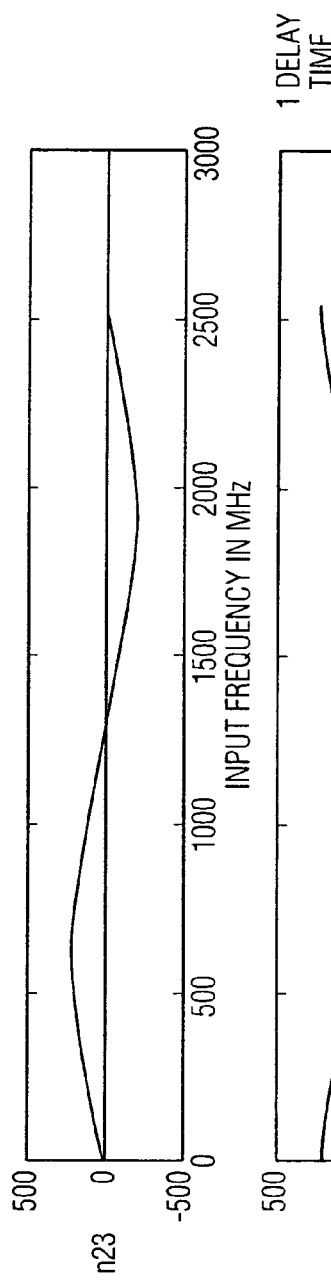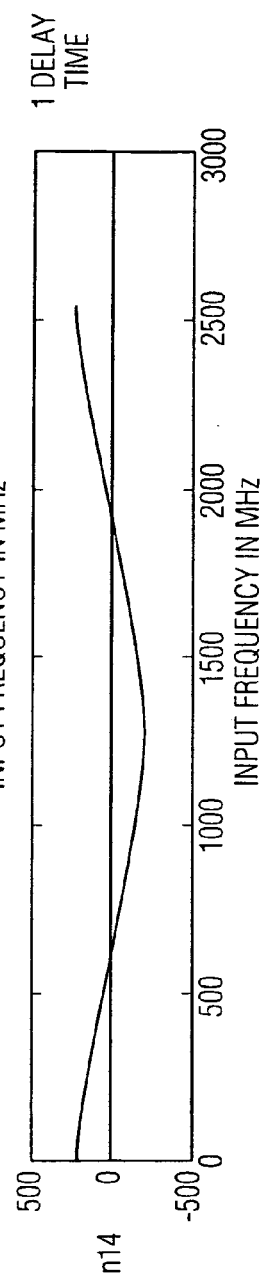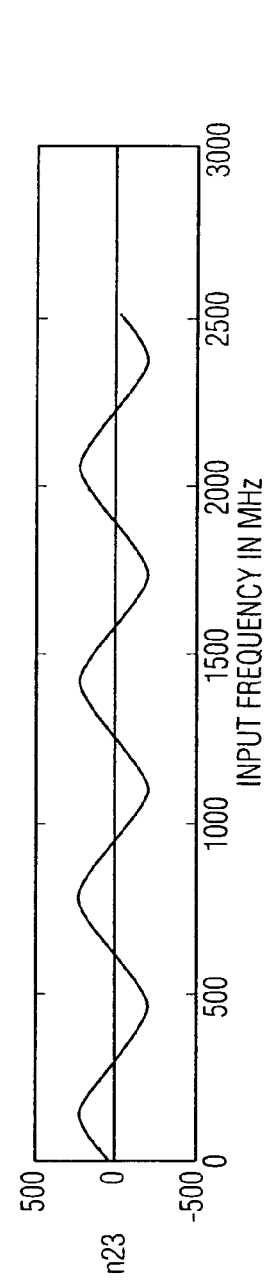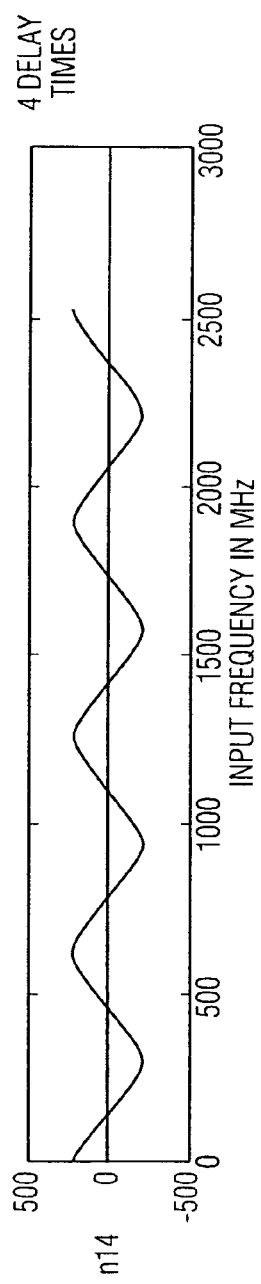
FIG. 6a
FIG. 6b
FIG. 6c
FIG. 6d

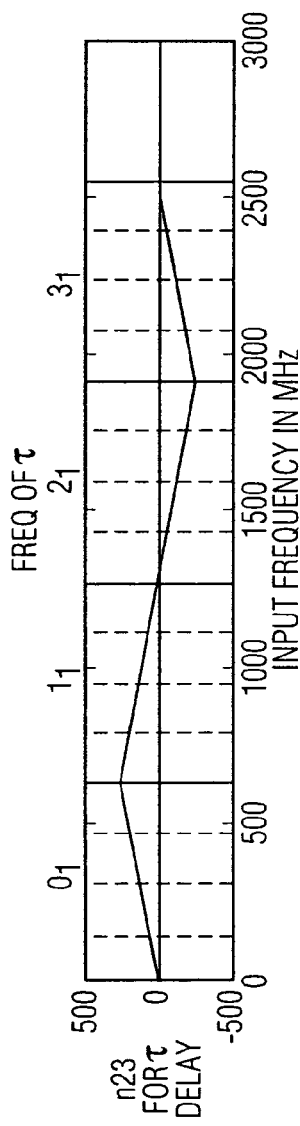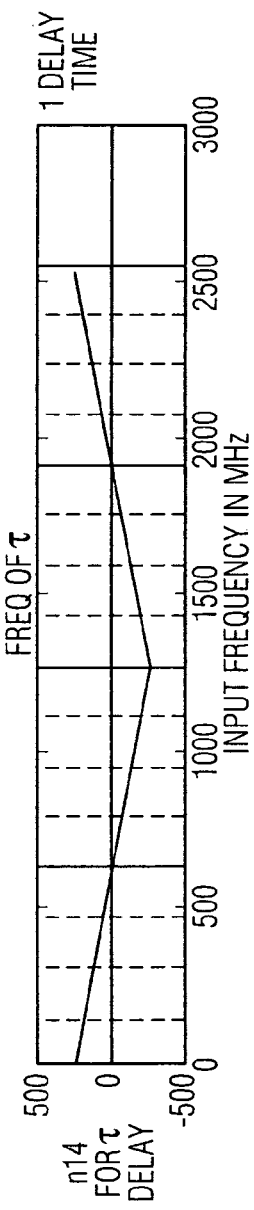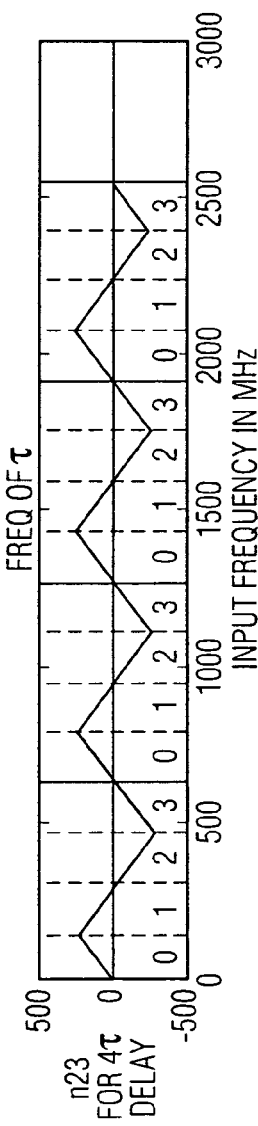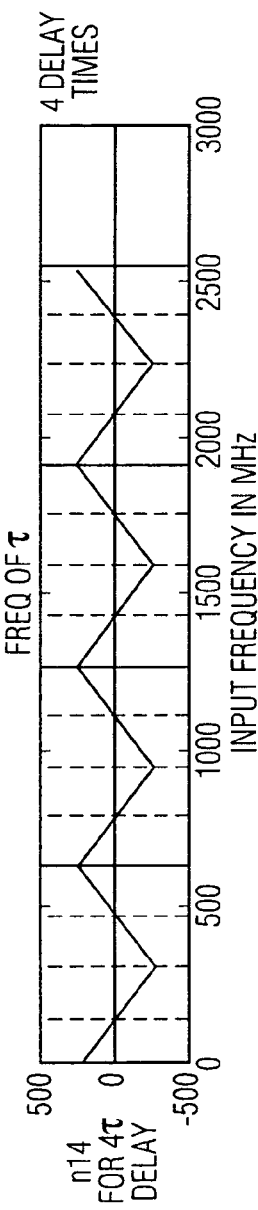
FIG. 9a
FIG. 9b
FIG. 9c
FIG. 9d

WIDEBAND DIGITAL IFM RECEIVER

TECHNICAL FIELD

The present invention relates, in general, to a method and apparatus for an instantaneous frequency measurement (IFM) receiver system. More specifically, the present invention relates to a method and apparatus for measuring instantaneous frequency of an input signal by directly digitizing the input signal, without using analog delay lines or video detectors.

BACKGROUND OF THE INVENTION

Electronic surveillance measurement (ESM) receivers commonly require that frequency calculations be performed on a received signal from targets of interest. The frequency of an input signal is often measured using an instantaneous frequency measurement (IFM) receiver. The IFM receiver, generally, uses a difference in phase between a delayed and a non-delayed version of the input signal to calculate the frequency of the input signal.

Two conventional IFM receivers are shown in FIGS. 1a and 1b. Referring first to FIG. 1a, a signal received from an antenna and/or an amplifier (not shown) is input into power divider (PD) 11a. A first signal output from the power divider is passed through an analog delay line, generally designated as 12a, to form a delayed signal characterized by $\cos(\omega t - \omega \tau)$. The delayed signal is then passed through a 90° hybrid, generally designated as 13a, to form $\cos(\omega t - \omega \tau)$ and $\sin(\omega t - \omega \tau)$. A second signal output from power divider 11a, characterized by $\cos \omega t$ is passed through a 180° hybrid, generally designated as 15a, to form a signal of $\cos \omega t$ and another signal of $-\cos \omega t$.

As also shown in FIG. 1a, system 10 passes the aforementioned signals through two additional 90° hybrids, generally designated as 13b and 13c, and onto four video detectors, generally designated as 14a, 14b, 14c and 14d. Video output signals, $A_2$ and $B_2$, are digitized and correlated by phase correlator 16a. Similarly, video output signals, $C_2$ and $D_2$, are digitized and correlated by phase correlator 16b. The correlated output signals, at points E and F, are provided to a processor (not shown) for further processing to determine the frequency of the input signal into system 10.

Another IFM receiver, generally designated as 17, is shown in FIG. 1b. As shown, the input signal is passed through power divider 11b to form two signals. One of the signals is delayed by an analog delay line, generally designated as 12b, and further divided by power divider 11c. The other signal, output from power divider 11b, is further divided by power divider 11d. These four divided output signals are, respectively, passed through a 90° hybrid, generally designated as 13d, and a 180° hybrid, generally designated as 15b. The output signals from the hybrids are then video detected by video detectors 14e, 14f, 14g and 14h. The four video output signals are then digitized and phase correlated by phase correlators 16c and 16d. As described with respect to FIG. 1a, the correlated output signals, at points E and F are further processed by a processor (not shown) to determine the frequency of the input signal received by system 17.

Conventional IFM receivers use analog components, such as hybrids, power dividers and crystal video detectors, as illustrated in FIGS. 1a and 1b, to convert a received input signal into video signals. These video signals are further processed to find the frequency of the received input signal. The frequency is obtained through phase measurement of the input signal and its delayed version. The basic functional building blocks of a conventional IFM receiver includes a correlator, as provided in system 10 and system 17.

System 10 and system 17 provide different approaches to determining the input frequency of a received signal. In system 10, three 90° hybrids and one 180° hybrid are used. In system 17, on the other hand, two 90° hybrids are shown replaced by two power dividers. In both system 10 and system 17, the input signal is divided into two paths, one path is delayed by a known delay time $\tau$, through an analog delay line, as shown. In both systems, the video signals are digitized and correlated. In building an IFM receiver, multiple correlators with different delay line lengths are typically needed. For example, some receivers may use four correlators and other receivers may use up to seven correlators.

It would be advantageous, if the number of delay lines required could be reduced. It would also be advantageous if the number of hybrids could be reduced. Furthermore, it would be advantageous if the number of crystal video detectors could be reduced.

The present invention provides such advantages by having a reduced number of components. As will be explained, analog delay lines are not necessary for the present invention. As will also be explained, the present invention only requires one 90° hybrid, and does not require any crystal video detectors.

SUMMARY OF THE INVENTION

To meet this and other needs, and in view of its purposes, the present invention provides an instantaneous frequency measurement (IFM) receiver including a hybrid for outputting in-phase (I) and quadrature (Q) signals from a received input signal; a first analog-to-digital converter (ADC) for digitizing the I signal to produce a first digital signal at a sampling rate of $1/\tau$, where $\tau$ is a sample time; a second ADC for digitizing the Q signal to produce a second digital signal at the same sampling rate of $1/\tau$; and a processor configured to delay the first and second digital signals by one sample time of $\tau$, and count number of samples produced having predetermined phase shifts. The processor is also configured to determine a frequency of the received input signal, based on the number of samples having the predetermined phase shifts. The first and second ADCs are each 1-bit analog-to-digital converters. A sampling clock is coupled to each ADC for sampling each ADC at a rate of $1/\tau$. The processor is configured to count the number of samples having the predetermined phase shifts of 0°, 90°, −90° and 180° over a predetermined time interval.

In another aspect of the invention, the processor is configured to delay the first and second digital signals by at least one of $2\tau$, $4\tau$, $8\tau$, $16\tau$, $32\tau$, or $64\tau$, in addition to the $1\tau$ sample time. The processor is also configured to count the number of samples produced having predetermined phase shifts at the at least one of $2\tau$, $4\tau$, $8\tau$, $16\tau$, $32\tau$, or $64\tau$, in addition to the $1\tau$ sample time.

Yet another aspect of the invention includes a look up table (LUT) for access by the processor, where the LUT includes values of numbers of samples at predetermined phase shifts of 0°, 90°, −90° and 180° as a function of input frequency for determining the frequency of the received input signal. The LUT may also include values of numbers of samples of n23 and n14 as a function of frequency having the following relationship:

$$n23 = n2 - n3$$

$n14 = n1 - n4$ where n1 is the predetermined phase shift of 0°,
n2 is the predetermined phase shift of 90°,
n3 is the predetermined phase shift of −90°, and
n4 is the predetermined phase shift of 180°.

Another embodiment of the present invention includes a method of determining the frequency of a signal having the following steps: (a) receiving a signal S; (b) sampling the signal S to form a digital signal C; (c) delaying C from itself by one sample time τ; (d) counting numbers of samples having predetermined phase shifts, after delaying C; and (e) determining the frequency of the signal S, based on the number of samples counted in step (d).

An aspect of the method includes the steps of: (f) forming in-phase (I) and quadrature (Q) signals from the signal S in step (a); (g) sampling the I and Q signals to form first and second digital signals, respectively; and (h) combining the first and second digital signals to form the combined signal C in step (b). Step (g) of the method includes (1) sampling the I and Q signals using respective one-bit analog-to-digital converters; and (2) sampling the I and Q signals at a sampling rate of 1/τ.

Another aspect of the method includes counting the number of samples having the predetermined phase shifts of 0°, 90°, −90° and 180° over a predetermined interval of time. Step (c) of the method may include delaying the signal C from itself by at least one of 2τ, 4τ, 8τ, 16τ, 32τ, or 64τ, in addition to the 1τ sample time, and step (d) may include counting the number of samples produced having predetermined phase shifts at the at least one of 2τ, 4τ, 8τ, 16τ, 32τ, or 64τ, in addition to the 1τ sample time.

Still another embodiment of the invention includes a method of determining a frequency of a signal having the steps of: (a) receiving a signal S; (b) forming in-phase (I) and quadrature (Q) signals from the signal S; (c) sampling the I and Q signals to form first and second digital signals; (d) combining the first and second digital signals to form a combined signal C; (e) delaying C from itself by one sample time τ; (f) counting numbers of samples having predetermined phase shifts of 0°, 90°, −90° and 180°, after delaying C; and (g) determining the frequency of the signal S, based on the numbers of samples counted in step (f) at each of the predetermined phase shifts. An aspect of step (c) includes sampling the I and Q signals using one bit ADCs during a predetermined time interval.

It is understood that the foregoing general description and the following detailed description are exemplary, but are not restrictive, of the invention.

BRIEF DESCRIPTION OF THE DRAWING

The invention is best understood from the following detailed description when read in connection with the accompanying drawing. Included in the drawing are the following figures:

FIGS. 6a–6d are graphical plots of values of n23 and n14 as a function of input frequency, with delay times of 1τ and 4τ that are similar, respectively, to FIGS. 5a–5d, except that noise has been added, resulting in the plotted functions appearing sinusoidal;

FIGS. 9a and 9b are graphical plots of values of n23 and n14 as a function of input frequency for 1τ delay in the two digital output signals depicted in FIG. 3, where the input frequency is divided into four frequency regions, in accordance with an embodiment of the present invention;

FIGS. 9c and 9d are graphical plots of the values of n23 and n14 as a function of input frequency for 4τ delay in the two digital output signals depicted in FIG. 3, where the input frequency is divided into four other frequency regions, in accordance with an embodiment of the present invention;

DETAILED DESCRIPTION OF THE INVENTION

Figure 2:
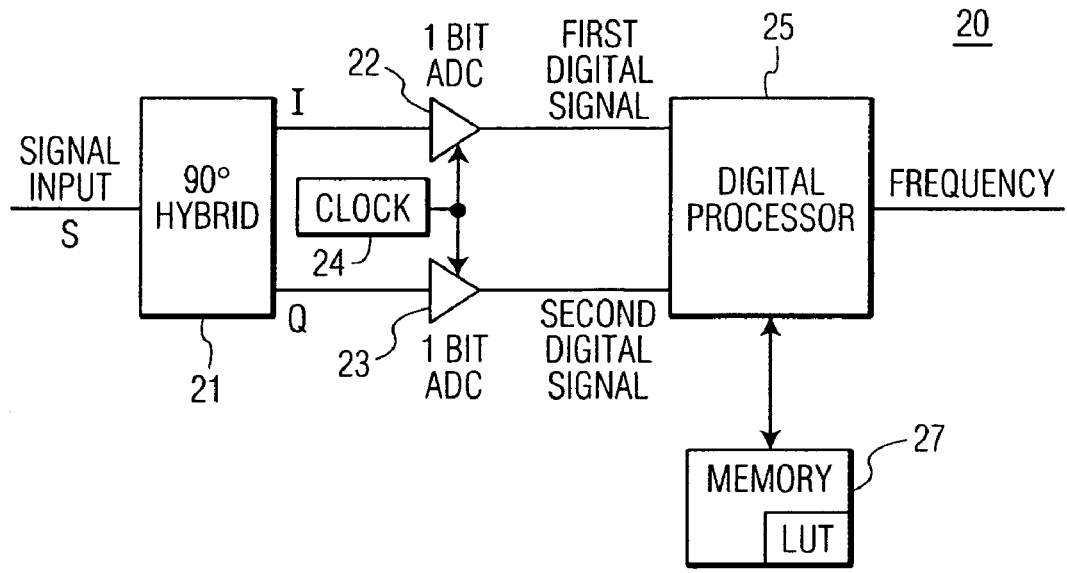
FIG. 2 is a block diagram of an IFM receiver, in accordance with an embodiment of the present invention.

Referring to FIG. 2, there is shown a digital instantaneous frequency measurement (IFM) receiver, generally designated as 20. The signal inputted into receiver 20 may be a radio frequency (RF) signal or it may be a down converted intermediate frequency (IF) signal. The input signal is of an unknown frequency. In accordance with the present invention, receiver 20 is effective in determining the input frequency. As will be explained, receiver 20 does not require analog delay lines, and does not require video detectors, as typically necessary in conventional IFM receivers.

As shown, the received signal passes through a 90° hybrid, generally designated as 21, to form a first analog signal I and a second analog signal Q. The second analog signal is delayed from the first analog signal by 90°. One bit analog-to-digital converter (ADC) 22 converts the first analog signal I into a first digital signal. Another one bit ADC, designated as 23, converts the second analog signal Q into a second digital signal. The first and second digital signals are provided to digital processor 25, which determines the input frequency of the received signal.

Generally, an IFM receiver, such as receiver 20, covers a wide bandwidth, for example 2 GHz and more. In order to achieve such wide bandwidth, the sampling frequency of receiver 20 must be high. The inventors realized that a high speed ADC having a low number of bits may be used to achieve speed for sampling the input signal. Accordingly, the inventors use a one bit ADC in the exemplary embodiment of the invention. In the exemplary embodiment of FIG. 2, ADC 22 and ADC 23 is each a one bit analog-to-digital converter. It will be appreciated that one bit ADCs may operate at speeds of tens of GHz in sampling frequency.

In order to cover an even wider bandwidth, an in-phase (I) and a quadrature (Q) approach is used by the exemplary embodiment shown in FIG. 2. Accordingly, the input signal is split into two paths, through a 90° hybrid, to form an I signal and a Q signal. The in-phase and quadrature signals are out of phase with respect to each other by 90 degrees.

Receiver 20 is configured, in accordance with the present invention, to provide the phase angle of the input signal at every sampling time, as sampled by clock 24. ADC 22 and ADC 23 are each sampled by clock 24 in a manner that is similar to a D type flip flop providing an output Q signal every sample period. This advantageously simplifies the signal processing required by receiver 20.

In order to cover the desired 2 GHz bandwidth, for example, a sampling frequency of 2.56 GHz is used by clock 24. A corresponding sampling time of 1τ is about 0.39 ns (½.56 GHz), which is the inverse of the sampling frequency. The sampling time of 1τ may be used as the shortest delay time in the IFM receiver. It will be appreciated that one bit ADCs are available at sampling speeds of up to 50 giga-samples per second (GSPS), allowing the IFM receiver to process very wide bandwidth input signals. Other sampling times may also be used, such as 2τ, 4τ, 8τ, 16τ, 32τ, and/or 64τ, and more. Since all these sampling times are multiples of one sampling time interval (1τ), there is no special timing adjustment that must be made by receiver 20. All of these sampling times, if necessary, may be executed by digital processor 25.

Digital processor 25 provides the delay times to find the phase difference between the received input signal and its delayed version. This phase difference is used to find the frequency of the received input signal. The delay time provided by digital processor 25 is the interval between various sampling times. According to the above example, the shortest delay time equals one sampling time interval 1τ, which is 0.39 ns. Longer delay times may equal multiples of the one sampling time interval 1τ, namely 2τ, 4τ, 8τ, 16τ, 32τ, 64τ, etc.

Figure 3:
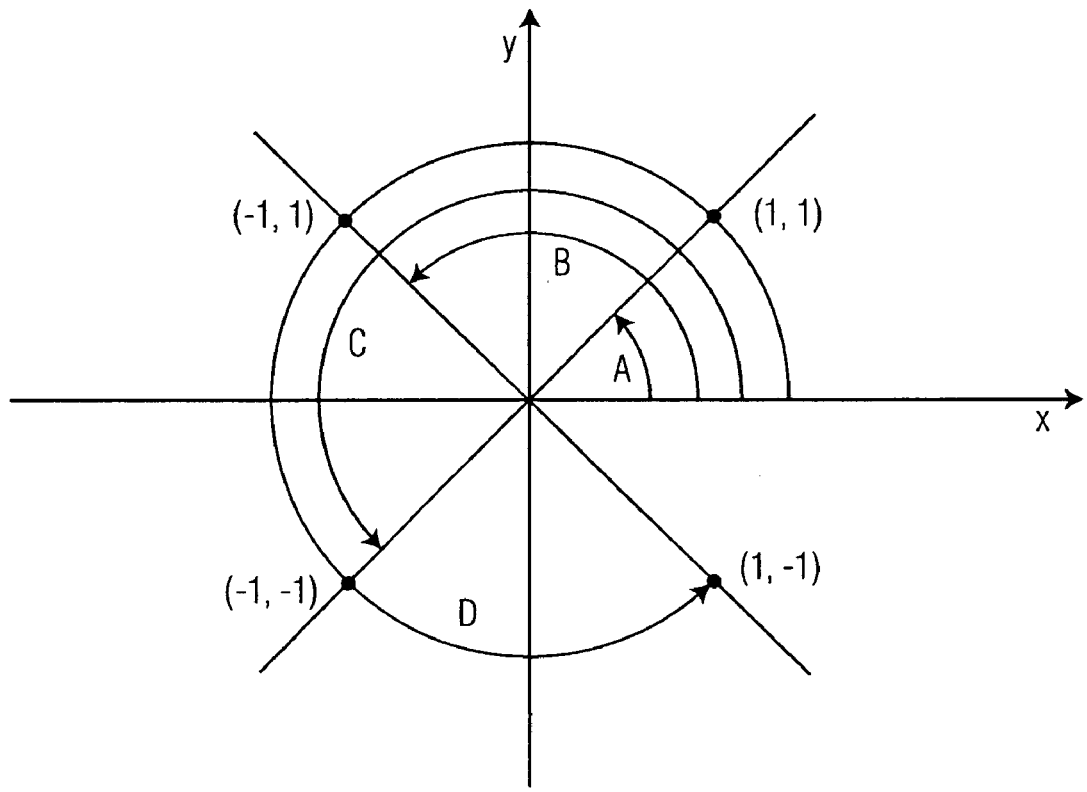
FIG. 3 depicts two digital output signals from two ADCs in the IFM receiver shown in FIG. 2, as real and imaginary output signals (x, y) representing four angles.

Since ADC 22 and ADC 23 are advantageously only one bit each, the formed outputs of the first digital signal and the second digital signal are either a+1 level or a−1 level. These two output signals from the two ADCs may be considered as one real component and one imaginary component, as exemplified in FIG. 3. As shown, the x and y axes represent real and imaginary components, respectively. The combination of the two output signals (x, y) provides four possible angles, as follows: When x=1, and y=1, angle A is formed; when x=−1, and y=1, angle B is formed; when x=−1 and y=−1, angle C is formed; finally, when x=1 and y=−1, angle D is formed. It may thus be seen, that the output angles only change by multiples of 90°.

When the input frequency of received signal S is below 2.56 GHz, as for example, having an input frequency from 10 to 2540 MHz, the maximum phase shift between two adjacent sampling times is plus (+) or minus (−) 180°. Accordingly, between two sampling times, there are four possible phase shifts, namely, 0°, 90°, −90° and 180°. In an embodiment of the present invention, plus (+) or minus (−) 180° are considered as one angle equal to 180°. The phase shift may be determined from the angle difference between two adjacent sampling times of $t_{n+1}$ and $t_n$.

Figure 4A:
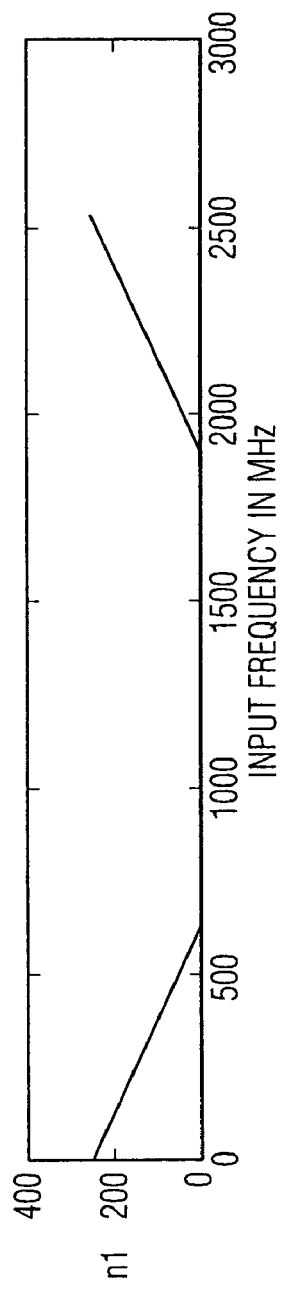
FIGS. 4a–4d are graphical plots of values of n1, n2, n3 and n4 as a function of input frequency, where n1 is a 0° phase shift, n2 is a 90° phase shift, n3 is a −90° phase shift and n4 is 180° phase shift, occurring when the two digital output signals depicted in FIG. 3 are delayed from themselves by one sampling time interval of 1τ, in accordance with an embodiment of the present invention.
Figure 4B:
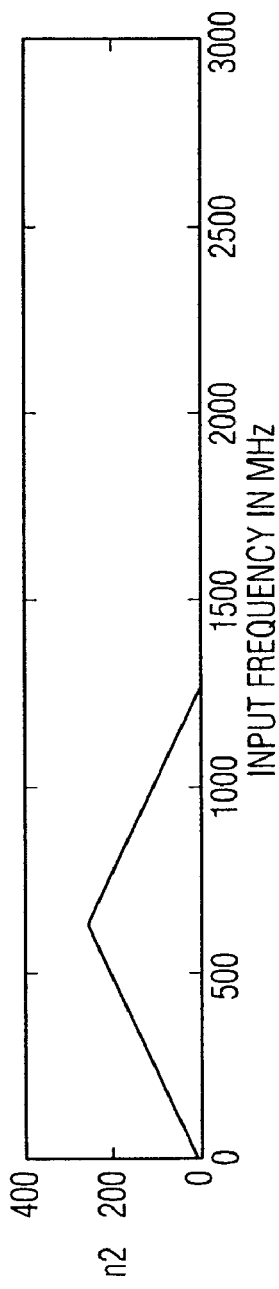
Figure 4C:
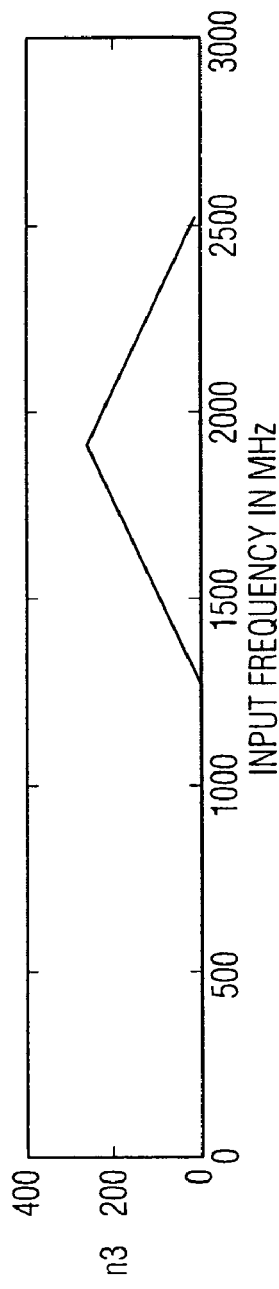
Figure 4D:
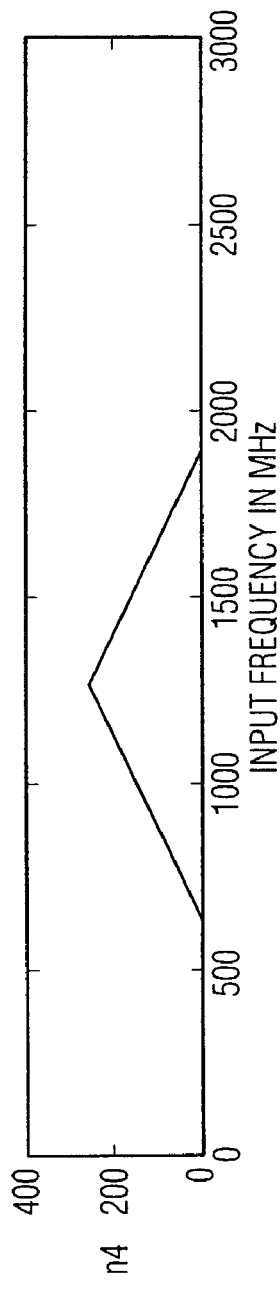

When the input frequency changes from 10 to 2540 MHz, for example, the number of phase shifts measured, or counted, by digital processor 25 over a predetermined interval of time (for example, 100 ns) is shown in FIGS. 4a, 4b, 4c and 4d. These figures depict four different phase shifts (0°, 90°, −90° and 180°) versus input frequency. FIG. 4a depicts values of n1 versus input frequency, where n1 represents the number of 0° phase shifts. FIG. 4b depicts n2 versus input frequency, where n2 represents the number of 90° phase shifts. FIG. 4c depicts n3 versus input frequency, where n3 represents the number of −90° phase shifts. Finally, FIG. 4d depicts n4 versus input frequency, where n4 represents the number of 180° phase shifts. All these numbers of phase shifts, as a function of input frequency, may be stored in a look up table (LUT) residing in memory 27, as shown in FIG. 2.

It will be appreciated that in the example shown in FIGS. 4a–4d, 256 samples may be taken over a period of 100 ns. For example, FIG. 4a shows 256 samples of 0° phase shift occurring at DC, or zero (0) input frequency. As another example, FIG. 4d shows 256 samples of 180° phase shift occurring at 1250 MHz input frequency.

Digital processor 25 combines the first digital signal and the second digital signal to form a combined signal, referred to herein as signal C. The results shown in FIGS. 4a–4d are based on the combined signal C being delayed from itself by one sample time of 1τ.

Values of n1, n2, n3 and n4, shown in FIGS. 4a–4d, may be combined to obtain n14 and n23, as follows:

$$n14 = n1 - n4 \text{ and}$$

$$n23 = n2 - n3.$$

Figure 5A:
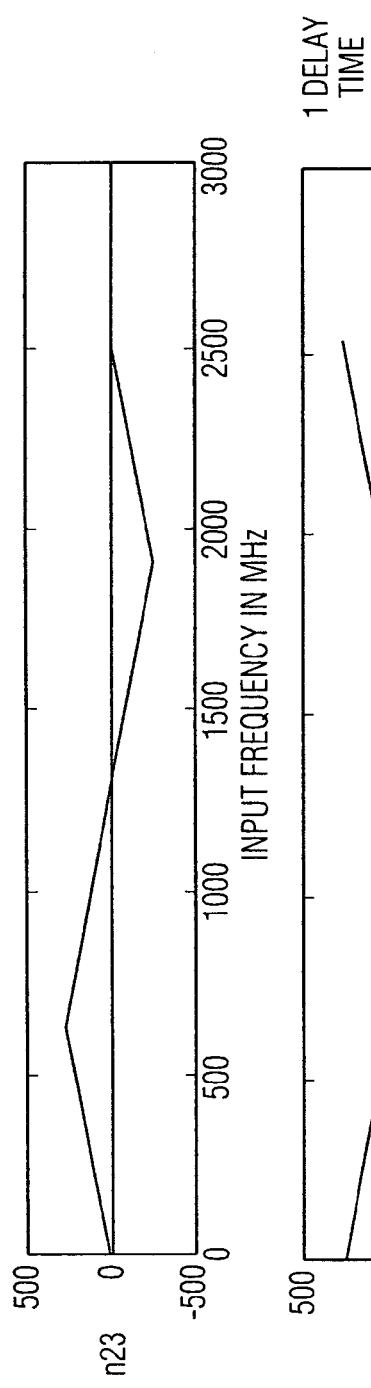
FIGS. 5a and 5b are graphical plots of values of n23 and n14 as a function of input frequency, where n23 is equal to n2−n3 and n14 is equal to n1−n4, occurring when the two digital output signals depicted in FIG. 3 are delayed from themselves by one sampling time interval of 1τ, in accordance with an embodiment of the present invention.
Figure 5B:
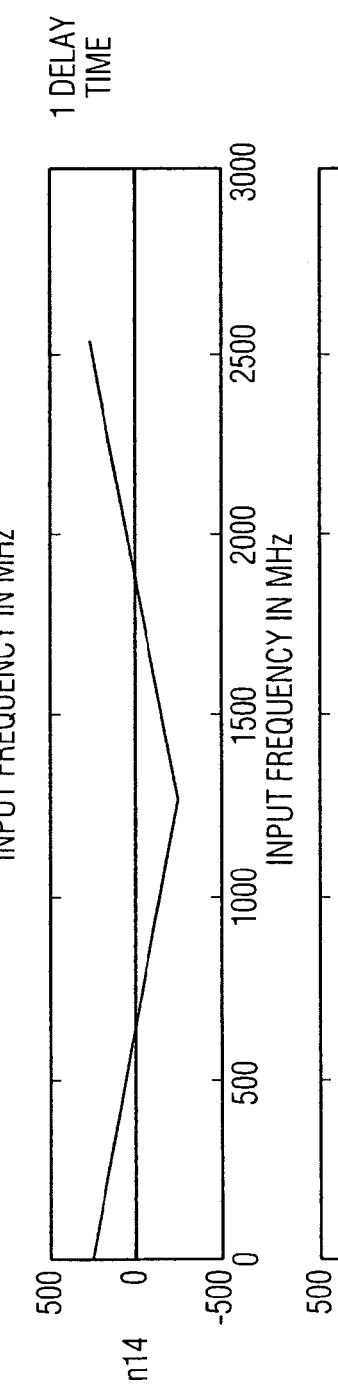

The results of the number of samples of n23 versus input frequency are shown in FIG. 5a and the results of the number of samples of n14 versus input frequency are shown in FIG. 5b. In both FIGS. 5a and 5b, the delay time used by digital processor 25 is one sampling interval (1τ).

Figure 5C:
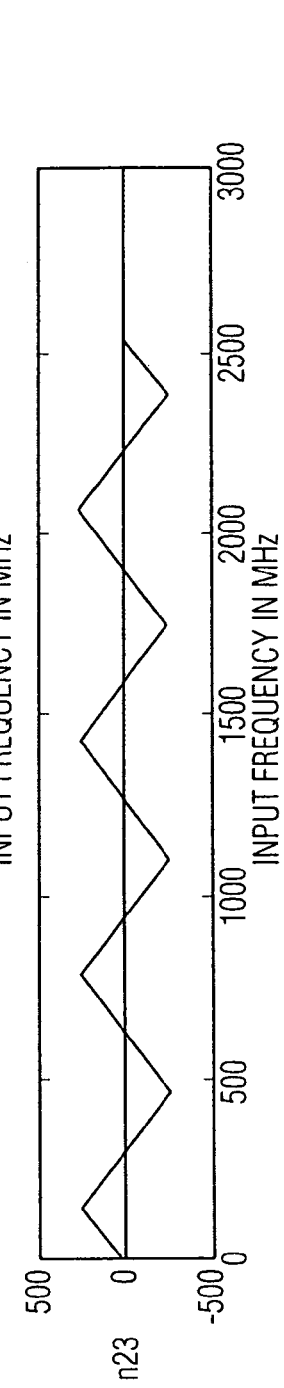
FIGS. 5c and 5d are graphical plots of values of n23 and n14 as a function of input frequency, where n23 is equal to n2−n3 and n14 is equal to n1−n4, occurring when the two digital output signals depicted in FIG. 3 are delayed from themselves by four sampling time intervals of 4τ, in accordance with an embodiment of the present invention.
Figure 5D:
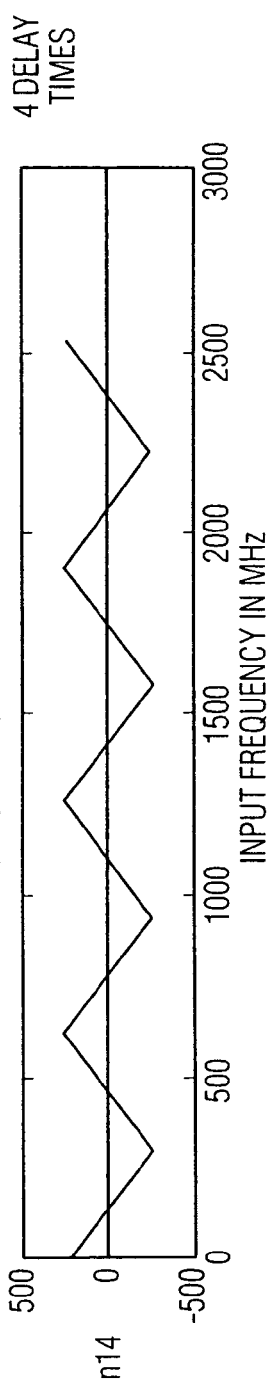

FIG. 5c depicts the number of samples of n23 versus input frequency and FIG. 5d depicts the number of samples of n14 versus input frequency. In both FIGS. 5c and 5d, the delay time used by processor 25 is 4τ, or four sampling intervals.

It will be appreciated that the triangular forms of the curves, shown in FIGS. 5a–5d, are realized in a theoretical environment, where system noise in the received signal is absent. When system noise is added to the input signal, as in a real environment, the forms of the curves become more sinusoidal in nature, as shown in FIGS. 6a, 6b, 6c and 6d.

FIGS. 6a–6d are, respectively, similar to FIGS. 5a–5d. The only difference between the two sets of figures is that the sharp edges in the curves have been smoothed by the system noise present in the received signal. As a result, the plotted functions appear more like sine or cosine waveforms.

Figure 1A:
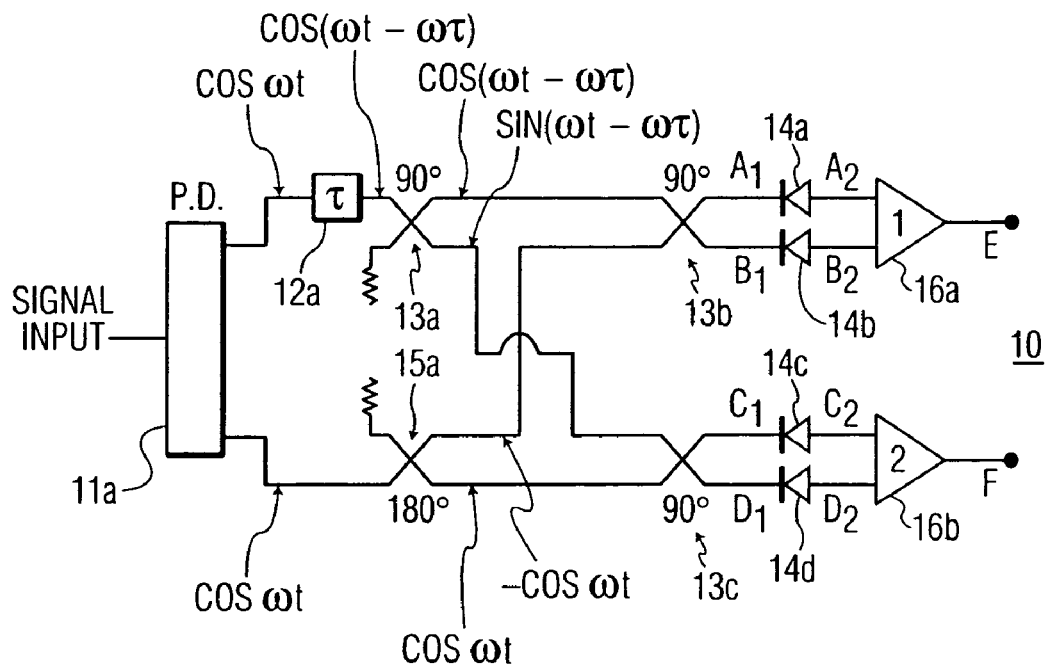
FIG. 1a is a diagram of a prior art IFM receiver.
Figure 1B:
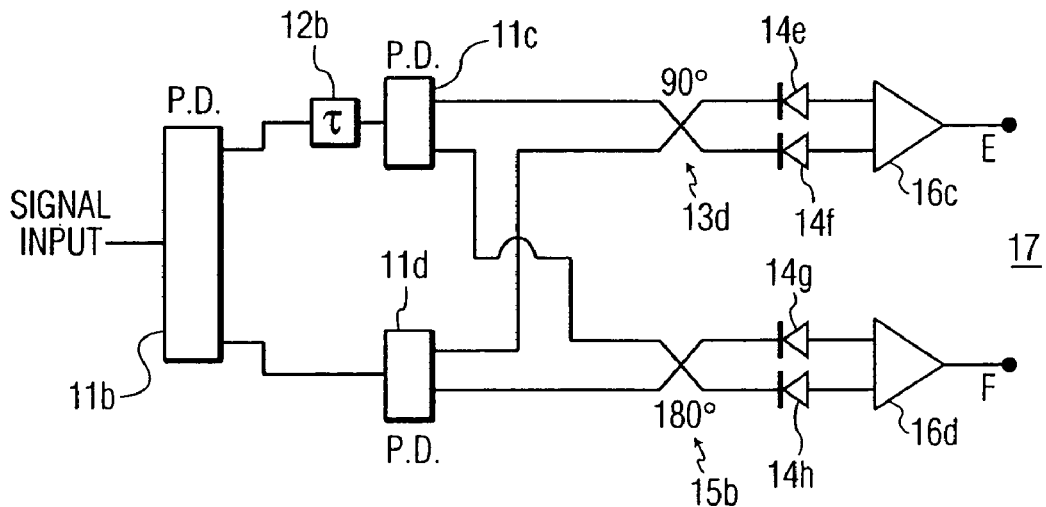
FIG. 1b is a diagram of another prior art IFM receiver.

The inventors discovered that the output curves shown in FIGS. 6a–6d are similar to output curves that may be present in an analog IFM receiver, at output points E and F, shown in FIGS. 1a and 1b. As such, the inventors realized that the outputs from the phase shifts processed by digital processor 25 may be encoded as a function of frequency to eventually determine the frequency of an input signal received by system 20 of FIG. 2.

As previously described, the delay times of the combined signal C, when delayed from itself, may be chosen as $1\tau$, $4\tau$, $16\tau$, $64\tau$, etc. The delays of $1\tau$, $4\tau$, and $16\tau$, for example, may be used to resolve any frequency ambiguity and to generate coarse frequency resolution. The longest delay of $64\tau$ may be used to generate the fine frequency resolution. It will be appreciated that there may be some advantage in ambiguity resolution by using delay times that are multiples of smaller intervals such as $2\tau$ (for example, $\tau$, $2\tau$, $4\tau$, etc.). This may require, however, more hardware resources within an FPGA (a fixed programmable gated array used as processor 25). Since the angle at every sampling time is calculated by processor 25, the phase differences between the different delay times may simply be found by the angle differences.

An exemplary frequency encoding method and noise effect used by the present invention is described in the following paragraphs. Referring to the top two figures of FIGS. 5a and 5b, or FIGS. 6a and 6b, the input frequency may be divided into four frequency regions, namely 0, 1, 2 and 3. The invention divides the input frequency as follows:

for frequency region 0, n14>0 and n23>0;
for frequency region 1, n14<0 and n23>0;
for frequency region 2 n14<0 and n23<0; and
for frequency region 3 n14>0 and n23<0.

Figure 7:
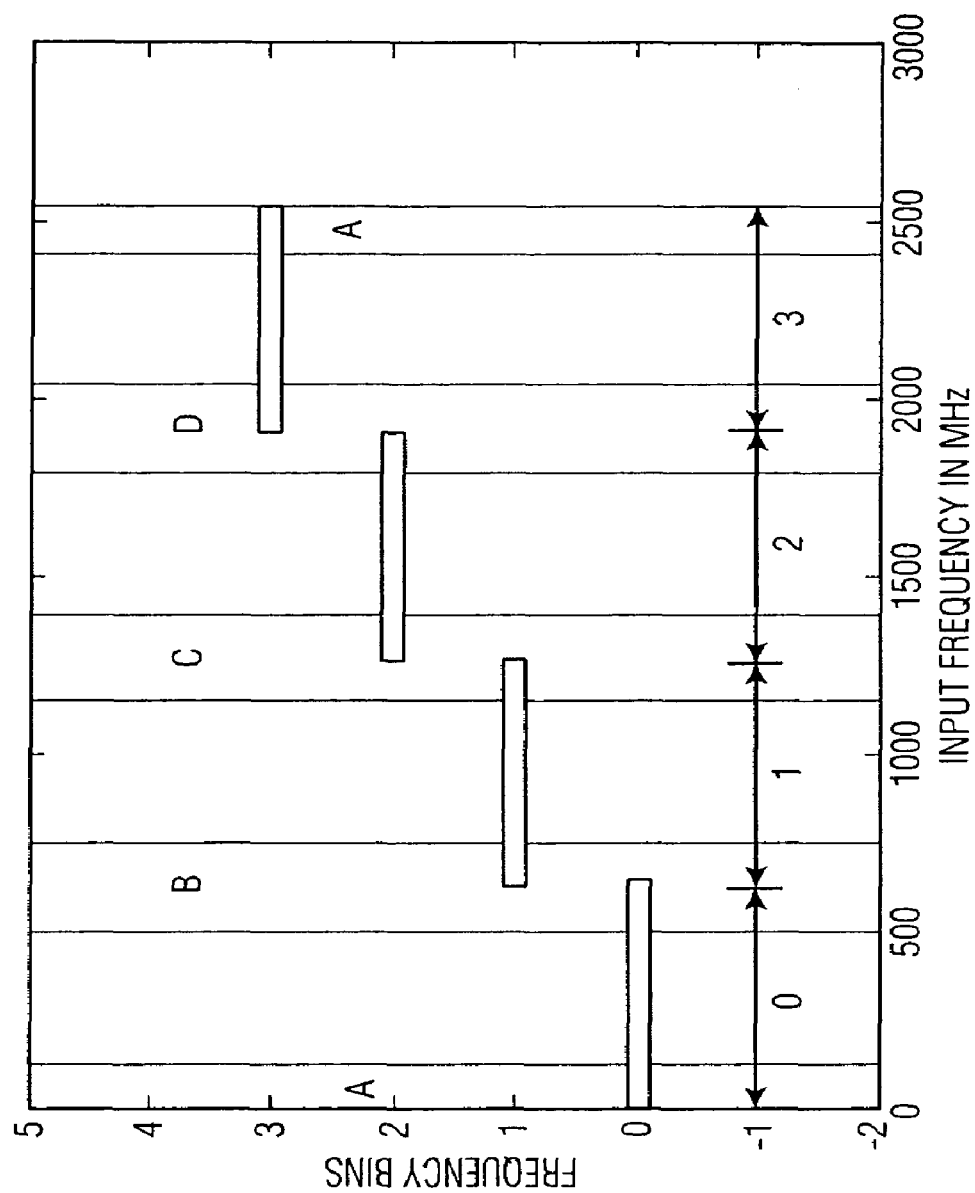
FIG. 7 is a graphical plot of frequency bins as a function of input frequency, where the input frequency shown in FIGS. 6a–6b is divided into four determinative frequency regions 0, 1, 2 and 3, and four less determinative frequency regions A, B, C and D that may cause erroneous determination of the input frequency, in accordance with an embodiment of the present invention.

These four frequency regions may be clearly determined when the input signal-to-noise (S/N) is high. When the S/N is low, indeterminate frequency regions near the edges of the four determinate frequency regions may cause erroneous results. These indeterminate frequency regions are marked as A, B, C and D in FIG. 7. In other words, the input signal may be placed in a wrong frequency bin, because of the presence of system noise.

Figure 8A:
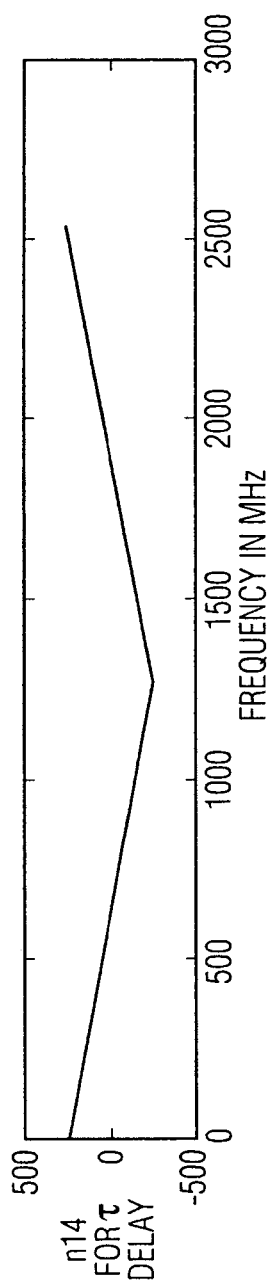
FIGS. 8a and 8b are graphical plots of values of n14 and n23 as a function of input frequency for a 1τ delay in the two digital output signals depicted in FIG. 3, in accordance with an embodiment of the present invention.
Figure 8B:
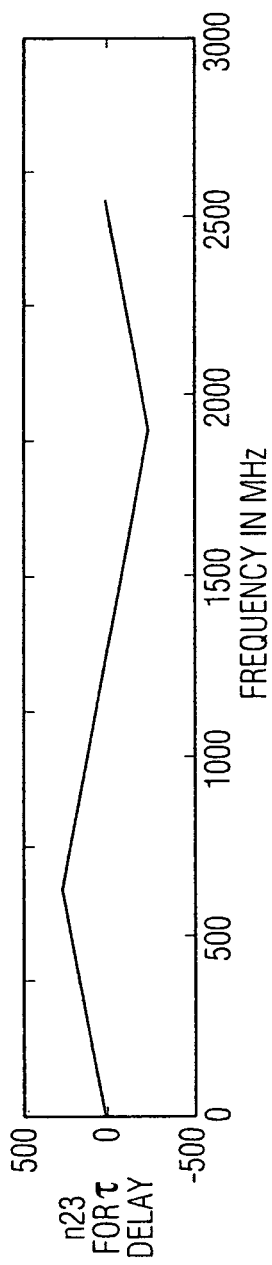
Figure 8C:
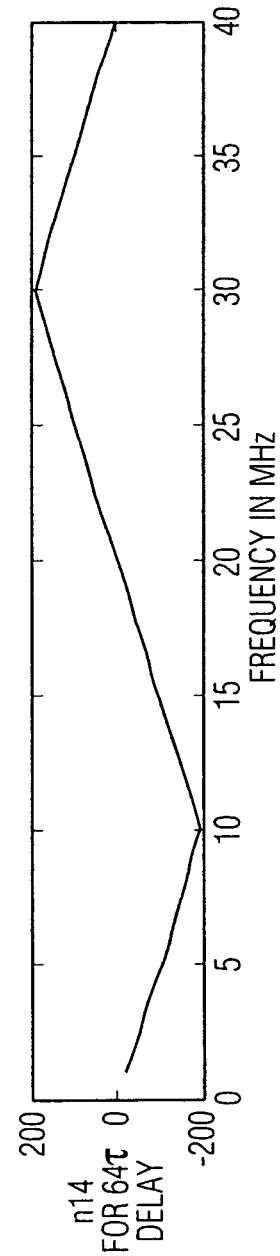
FIGS. 8c and 8d are graphical plots of values of n14 and n23 as a function of input frequency for a 64τ delay in the two digital output signals depicted in FIG. 3, in accordance with an embodiment of the present invention.
Figure 8D:
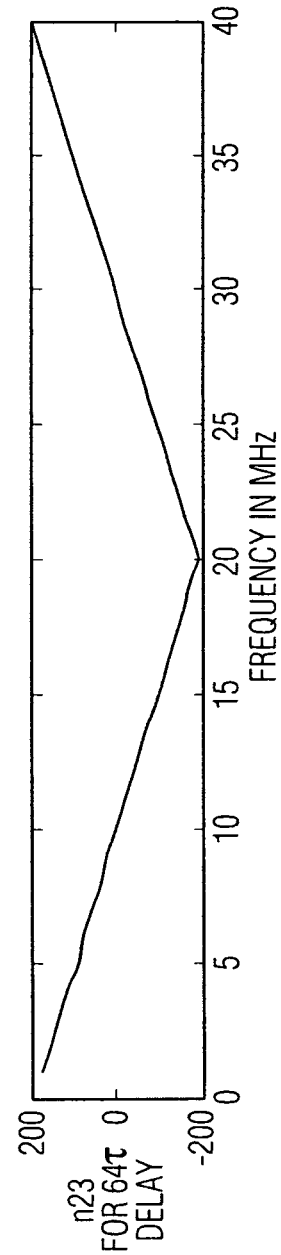

From experimental results, the inventors discovered that the widths of regions A, B, C and D are wider for shorter delay times and narrower for longer delay times. This phenomenon may be explained by referring to FIGS. 8a–8d. One cycle of delay, with delay time $1\tau$, is 2560 MHz and the corresponding n14 and n23 sampled values are shown in FIGS. 8a and 8b. For this example, the maximum n14 value for $1\tau$ delay is 251 and the corresponding frequency range is 2560 MHz. The maximum n14 value for $64\tau$ delay, as shown in FIGS. 8c and 8d, is 192 and the corresponding frequency is 40 MHz. The slope of the line in FIG. 8a is 0.098(251/2560) and the slope of the line in FIG. 8b is 4.8(192/40). The steeper slope experiences less noise effect.

Using the above frequency division, a method of the invention divides the 40 MHz range into 4 frequency regions with a fine frequency resolution of 10 MHz. In this frequency encoding method, the present invention assumes that the fine frequency (10 MHz) measured from the longest delay time is encoded correctly. In other words, the A, B, C and D regions in FIG. 7 have zero widths. This assumption determines the sensitivity of the IFM receiver. On the other hand, the frequency resolution from the shorter delay times may have ambiguous frequency regions, designated as A, B, C and D regions in FIG. 7.

An approach used by the present invention to resolve the ambiguous regions is to use both frequency ranges, going from the finer frequency resolution to the next higher coarse frequency resolution. In FIGS. 9a–9d, the delay times of $1\tau$ and $4\tau$ are used as an example. In this example, the present invention assumes that the frequency resolution from the $4\tau$ delay time, shown in FIGS. 9c–9d, is correct. The frequency may be divided into 16 regions, which are labeled [0, 1, 2, 3] four times. The frequency may be determined from the values of 0, 1, 2, 3 and n14 and n23 of delay time $1\tau$, shown in FIGS. 9a–9b.

Using the values shown in FIGS. 9a–9d, a look up table (LUT) may be formed and stored by processor 25 and used to decode, or determine, the input frequency of the received signal. The LUT shown in Table 1 may be such an example.

Table 1. Conditions used to determine coarse frequency from finer frequency.

TABLE 1

Conditions used to determine coarse frequency from finer frequency.

| Freq reading for $4\tau$ | n14 | n23 | n14 and n23 | Freq reading for $1\tau$ |
|---|---|---|---|---|
| 0 | >0 |  | Abs(n14) > abs(n23) | $0_1$ |
| 0 |  | >0 | Abs(n23) > abs(n14) | $1_1$ |
| 0 | <0 |  | Abs(n14) > abs(n23) | $2_1$ |
| 0 |  | <0 | Abs(n23) > abs(n14) | $3_1$ |
| 1 | >0 | >0 |  | $0_1$ |
| 1 | <0 | >0 |  | $1_1$ |
| 1 | <0 | <0 |  | $2_1$ |
| 1 | >0 | <0 |  | $3_1$ |
| 2 | >0 | >0 |  | $0_1$ |
| 2 | <0 | >0 |  | $1_1$ |
| 2 | <0 | <0 |  | $2_1$ |
| 2 | >0 | <0 |  | $3_1$ |
| 3 |  | >0 | Abs(n23) > abs(n14) | $0_1$ |
| 3 | <0 |  | Abs(n14) > abs(n23) | $1_1$ |
| 3 |  | <0 | Abs(n23) > abs(n14) | $2_1$ |
| 3 | >0 |  | Abs(n14) > abs(n23) | $3_1$ |

This table may be generated from FIGS. 9a–9d, where $0_1$, $1_1$, $2_1$ and $3_1$ and the frequency regions for delay time $1\tau$ and $4\tau$ are stored. The rule in this table may be applied to any two adjacent frequency resolutions, such as between the delays of $16\tau$ and $64\tau$, or between the delays of $4\tau$ and $16\tau$.

In the exemplary embodiment above, the fine frequency resolution is 10 MHz. Usually, finer frequency resolution may be desirable. In order to achieve this finer resolution, more than 2 bits may be generated from the longest delay time. This may be achieved by comparing n14 and n23 and dividing the frequency in finer ranges. If 4 bits are generated from the longest delay time, the corresponding frequency resolution is 2.5 MHz ($10/4$), and if 5 bits are generated from the longest delay time, the corresponding frequency resolution is 1.25 MHz ($10/8$).

It will be appreciated that the $1\tau$ delay, by itself, may provide unambiguous frequency determination. The $2\tau$ delay, on the other hand, has 2 ambiguities, whereas the $4\tau$ delay has 4 ambiguities, etc.

Figure 10:
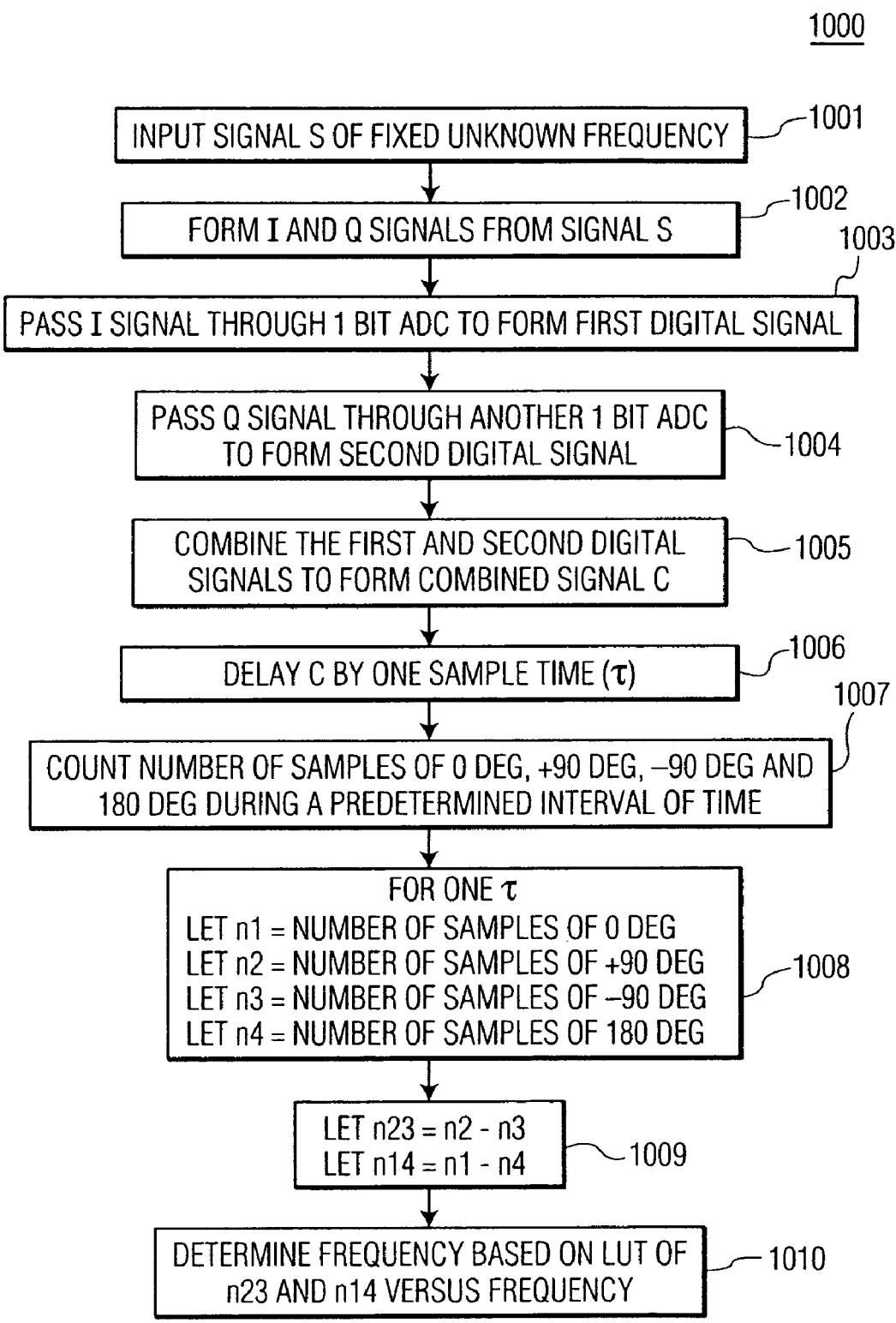
FIG. 10 is a flow diagram of a method of the present invention, where the input signal S, received by the system shown in FIG. 2, is digitized and combined to form signal C, which is delayed from itself by one sample time (1τ), in accordance with an embodiment of the present invention.
Figure 11:
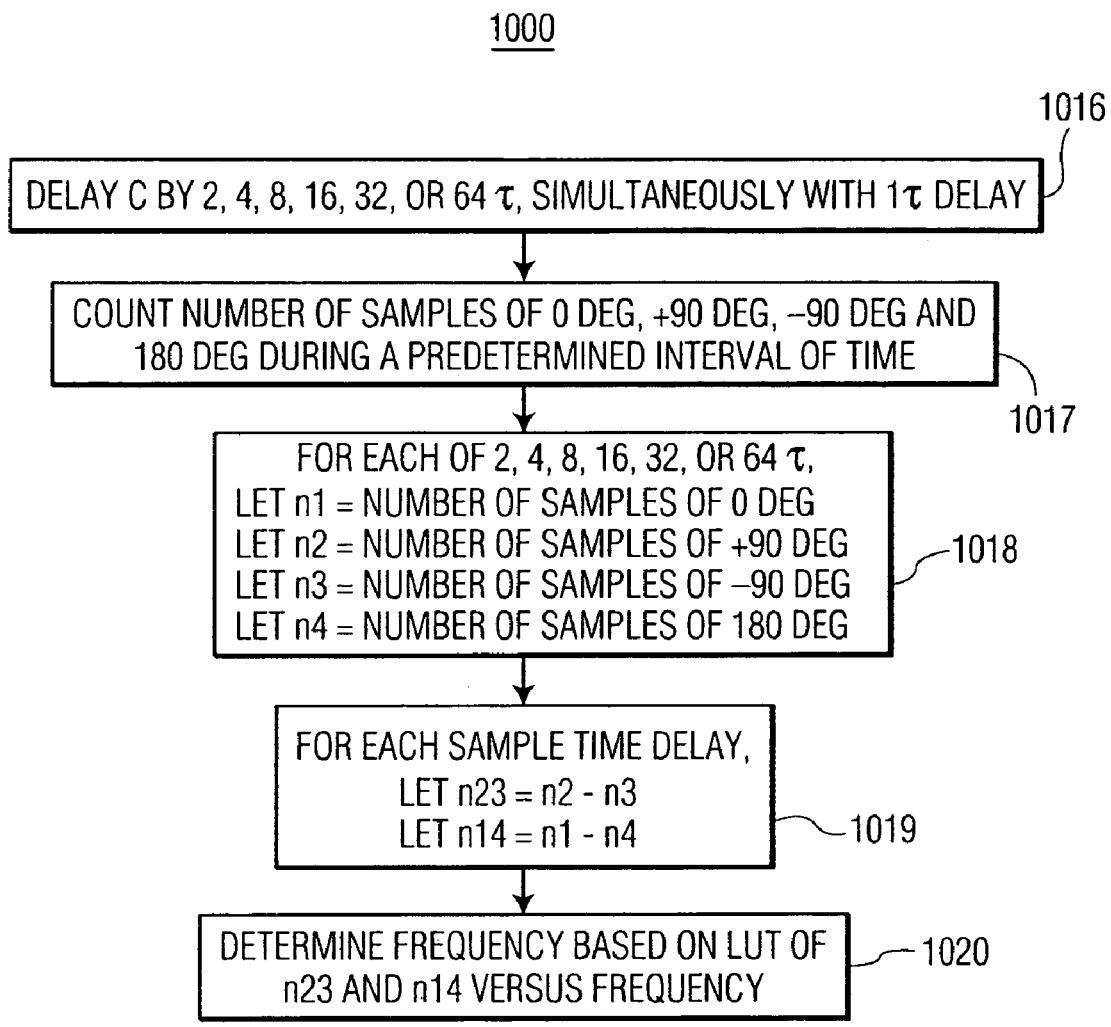
FIG. 11 is another exemplary embodiment of a method of the present invention in which the combined signal C is delayed from itself by at least one of 2τ, 4τ, 8τ, etc., in addition to a 1τ delay time, in accordance with an embodiment of the present invention.

Referring now to FIGS. 10 and 11, there is shown a method of the present invention, generally designated as 1000. With reference to FIG. 2, method 1000 receives input signal S having a fixed, unknown frequency. Step 1002 forms an I signal and a Q signal by passing signal S through 90° hybrid 21. Step 1003 passes the I signal through 1 bit ADC 22 to form the first digital signal. Similarly, step 1004 passes the Q signal through 1 bit ADC 23 to form the second digital signal. Digital processor 25 combines both the first and second digital signals to form a combined signal C, using method step 1005.

Using step 1006 of the method, processor 25 delays the combined signal C from itself by one sample time 1τ. Using step 1007 next, processor 25 counts the number of samples at 0° phase, +90° phase, −90° phase and 180° phase during a predetermined interval of time. Such predetermined interval of time may be, for example, 100 ns.

Referring to step 1008 of the method, processor 25 counts the number of samples at 0° phase and lets that number equal n1. The processor counts the number of samples at +90° phase and lets that number equal n2. The processor counts the number of samples at −90° and lets that number equal n3. Finally, the processor counts the number of samples at 180° phase and lets that number equal n4. In step 1009 of the method, processor 25 computes n23, which is equal to n2−n3. Similarly, the processor computes n14, which is equal to n1−n4. Using the counted samples over the predetermined time interval, a LUT is consulted in step 1010, which contains results of the number of samples versus input frequency, as shown in FIGS. 5a–5b, or 6a–6b. Using the LUT, the frequency of the input signal S may be determined.

Referring next to FIG. 11, at step 1016, processor 25 may delay the combined signal C from itself by 2τ, 4τ, 8τ, 16τ, 32τ, 64τ, etc., concurrently with the 1τ delay performed in step 1006. Method 1000 then enters step 1017 and counts the number of samples at 0° phase, +90° phase, −90° phase and 180° phase during the predetermined interval of time, such as 100 ns.

Step 1018 of the method determines the number of samples at 0° phase for one or more of the delays to combined signal C performed in step 1016. The number of samples determined at 0° phase is set to be n1. Similarly, the number of samples determined to be at +90° phase is set to be n2. The number of samples determined at −90° phase is set to n3. Finally, the number of samples determined at 180° phase is set to n4. Again, the number of samples at n1, n2, n3 and n4 are determined for each of one or more of the delays to combined signal C performed in step 1016. In step 1019 of the method, for each sample time delay performed in step 1016, the processor computes n23, which equal n2−n3 and computes n14, which equals n1−n4. Using the determined sample numbers, the method in step 1020 determines the frequency of the received signal by using another LUT, which may contain values similar to the values plotted in FIGS. 5c–5d, or 6c–6d (showing 4τ delay).

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. An instantaneous frequency measurement (IFM) receiver comprising
a hybrid for outputting I and Q signals from a received input signal,
a first analog-to-digital converter (ADC) for digitizing the I signal to produce a first digital signal at a sampling rate of 1/τ, where τ is a sample time,
a second ADC for digitizing the Q signal to produce a second digital signal at the same sampling rate of 1/τ, the first and second ADCs are each 1-bit analog-to-digital converters,
a processor configured to delay the first and second digital signals by one sample time of τ, and count numbers of samples produced having predetermined phase shifts, and
the processor configured to determine a frequency of the received input signal, based on the number of samples having the predetermined phase shifts, and provide the determined frequency to a user.

2. The IFM receiver of claim 1 including
a sampling clock coupled to each ADC for sampling each ADC at a rate of 1/τ.

3. The IFM receiver of claim 1 wherein
the processor is configured to count the number of samples having the predetermined phase shifts of 0°, 90°, −90° and 180° over a predetermined time interval.

4. The IFM receiver of claim 3 wherein
one τ is a delay time between two adjacent sampling intervals, and
180° is a maximum phase shift between two adjacent sampling times.

5. The IFM receiver of claim 1 wherein
the first and second digital signals are combined to form real and imaginary components of (x, y) where
(1, 1) represents an angle between 0° and 90°,
(−1, 1) represents an angle between 90° and 180°,
(−1, 1) represents an angle between 180° and 270°, and
(−1, −1) represents an angle between 270° and 360°.

6. The IFM receiver of claim 1 wherein
the processor is configured to delay the first and second digital signals by at least one of 2τ, 4τ, 8τ, 16τ, 32τ, or 64τ, in addition to the 1τ sample time, and
the processor is configured to count the number of samples produced having predetermined phase shifts at the at least one of 2τ, 4τ, 8τ, 16τ, 32τ, or 64τ, in addition to the 1τ sample time.

7. The IFM receiver of claim 6 including
a look up table (LUT) for access by the processor, wherein
the LUT includes values of numbers of samples at predetermined phase shifts of 0°, 90°, −90° and 180° as a function of input frequency for determining the frequency of the received input signal.

8. The IFM receiver of claim 7 wherein
the LUT includes values of number of samples of n23 and n14 as a function of frequency having the following relationship:

$$n23 = n2 - n3$$

$$n14 = n1 - n4$$

where
n1 is the number of samples counted with a predetermined phase shift of 0°,
n2 is the number of samples counted with a predetermined phase shift of 90°,
n3 is the number of samples counted with a predetermined phase shift of −90°, and
n4 is the number of samples counted with a predetermined phase shift of 180°.

9. A method of determining a frequency of a signal in an IFM receiver, comprising the steps of:
(a) receiving, by a hybrid, a signal S to form I and Q signals;
(b) sampling the I and Q signals, by respective one-bit ADCs, to form digital I and Q signals, and combining the digital I and Q signals to form a combined signal C;
(c) delaying, by a processor, C from itself by one sample time τ;

(d) counting, by the processor, numbers of samples having predetermined phase shifts, after delaying C;
(e) determining, by the processor, the frequency of the signal S, based on the number of samples counted in step (d); and
(f) providing the determined frequency to a user.

10. The method of claim 9 wherein
step (b) includes sampling the I and Q signals at a sampling rate of $1/\tau$.

11. The method of claim 9 wherein
step (d) includes counting the number of samples having the predetermined phase shifts of 0°, 90°, −90° and 180° over a predetermined interval of time.

12. The method of claim 9 including the steps of:
storing a look up table (LUT) with values of numbers of samples at the predetermined phase shifts of 0°, 90°, −90° and 180° as a function of frequency; and
determining the frequency of the received input signal, based on the values stored in the LUT.

13. The method of claim 12 including the step of:
incorporating, into the LUT, values of numbers of samples of n23 and n14 as a function of frequency having the following relationship:

$n23=n2-n3$ $n14=n1-n4$ where
n1 is the number of samples counted with a predetermined phase shift of 0°,
n2 is the number of samples counted with a predetermined phase shift of 90°,
n3 is the number of samples counted with a predetermined phase shift of −90°, and
n4 is the number of samples counted with a predetermined phase shift of 180°.

14. The method of claim 9 wherein
step (c) includes delaying the signal C from itself by at least one of $2\tau$, $4\tau$, $8\tau$, $16\tau$, $32\tau$, or $64\tau$, in addition to the $1\tau$ sample time, and
step (d) includes counting the number of samples produced having predetermined phase shifts at the at least one of $2\tau$, $4\tau$, $8\tau$, $16\tau$, $32\tau$, or $64\tau$, in addition to the $1\tau$ sample time.

15. A method of determining a frequency of a signal comprising the steps of:
(a) receiving a signal S;
(b) forming in-phase (I) and quadrature (Q) signals from the signal S;
(c) sampling the I and Q signals, using one bit ADCs during a predetermined time interval, to form first and second digital signals;
(d) combining the first and second digital signals to form a combined signal C;
(e) delaying C from itself by one sample time $\tau$;
(f) counting numbers of samples having predetermined phase shifts of 0°, 90°, −90° and 180°, after delaying C; and
(g) determining the frequency of the signal S, based on the number of samples counted in step (f) at each of the predetermined phase shifts, and providing the determined frequency to a user.

16. The method of claim 15 wherein
step (g) includes comparing the number of samples counted in step (f) at each of the predetermined phase shifts with respective numbers of samples stored in a LUT to determine the frequency of the signal S.

* * * * *